United States Patent [19]

Gross et al.

[11] Patent Number: 5,327,095
[45] Date of Patent: Jul. 5, 1994

[54] METHOD AND CIRCUIT FOR INCREASING THE OUTPUT IMPEDANCE OF AN INACTIVE AMPLIFIER

[75] Inventors: William H. Gross, Sunnyvale; John W. Wright, Los Altos, both of Calif.

[73] Assignee: Linear Technology Corporation, Milpitas, Calif.

[21] Appl. No.: 20,619

[22] Filed: Feb. 19, 1993

[51] Int. Cl.$^5$ ............................................. H03F 1/36
[52] U.S. Cl. ........................................ 330/75; 330/255; 330/260; 330/84; 330/291; 330/295; 330/124 R
[58] Field of Search .................. 330/85, 84, 291, 292, 330/293, 295, 51, 124 R, 124 D, 75, 98, 255, 260

[56] References Cited

U.S. PATENT DOCUMENTS 4,799,026  1/1989  La Barge et al. ..................... 330/51

OTHER PUBLICATIONS

"Maxim CMOS Video Multiplexer/Amplifier," data sheet published by Maxim Integrated Products, dated 1992, Sunnyvale, Calif., pp. 1–8.
"Maxim High-Speed Video Multiplexer/Amplifier," data sheet published by Maxim Integrated Products, dated 1992, Sunnyvale, Calif., pp. 1–12.
"Elantec EL2021C Monolithic Pin Driver," data sheet (dated Jul. 1991) published by Elantec, Inc. in the *1992 Data Book-Elantex*, Milpitas, Calif., pp. 7-3 to 7-12.
"GX4314 Wideband, Monolithic 4x1 Video Crosspoint Switch," Preliminary Data Sheet published by Gennum Corporation in the *Gennum 1992 Data Book*, Ontario, Canada, pp. 2–41 to 2–43.
"GX434 Monolithic 4x1 Video Crosspoint Switch," data sheet published by Gennum Corporation in the *Gennum 1992 Data Book*, Ontario, Canada, pp. 2–31 to 2–39.
"CA3080, CA3080A Types-Operational Transconductance Amplifiers (OTA's)," data sheet published by RCA Corporation in the *RCA Solid State Linear Integrated Circuits* data book, dated 1978, USA, pp. 146–151.

*Primary Examiner*—James B. Mullins
*Assistant Examiner*—James Dudek
*Attorney, Agent, or Firm*—Laurence S. Rogers; Robert W. Morris

[57] ABSTRACT

A method and circuit for increasing the output impedance of an inactive amplifier is provided. The method and circuit allows an increased number of amplifiers to be coupled in parallel to a single transmission line for distributing a plurality of video or other electrical signals to a remote location. The method and circuit increasing the impedance of an amplifier feedback network during inactive operation using a bootstrapping technique (i.e., by driving the feedback network) so as to increase the overall impedance of the amplifier during such operation.

65 Claims, 7 Drawing Sheets

METHOD AND CIRCUIT FOR INCREASING THE OUTPUT IMPEDANCE OF AN INACTIVE AMPLIFIER

BACKGROUND OF THE INVENTION

The present invention relates to an amplifier for use in distributing video and other electrical signals. More particularly, the present invention relates to a method and circuit for increasing the output impedance of an inactive amplifier for use in transmitting such signals through a transmission line.

In the distribution of video and other electrical signals, it is often desirable to use a single transmission line (e.g., a coaxial cable or parallel conductors) to transmit a plurality of signals. Typically, a plurality of amplifiers will be coupled in parallel to such a line to transmit respective signals. In such distribution systems, it is desirable to be able to couple a large number of amplifiers to the transmission line in order to reduce the cost and complexity of distributing a plurality of signals to a remote location.

Generally, when a plurality of amplifiers are coupled in parallel to a single transmission line, the loading effect of the amplifiers on the transmission line must be taken into account. For example, while a particular amplifier is active and coupling a signal to the transmission line, it is desirable that the remaining amplifiers commonly coupled to the same transmission line do not disturb such coupling (i.e., the back termination of the transmission line). In other words, it is desirable that the remaining amplifiers do not alter the impedance of the load which the coupling amplifier drives.

In particular, the output impedance of an active amplifier and a series back-termination resistor is generally matched to the characteristic impedance of the transmission line in order to minimize reflection of power at the transmission line interface. Typically, since the output impedance of an active amplifier is substantially less than one ohm, the back-termination resistor is normally chosen to have a resistance that substantially matches the characteristic impedance of the transmission line. Such impedance matching increases the efficiency of the transmission system.

However, if the remaining amplifiers alter the impedance of the load (i.e., the back termination of the transmission line) which the coupling amplifier drives, then the series combination of the active coupling amplifier and back-termination resistor will no longer be matched to its load. This results in inefficiency and, in a worst case, can prohibit transmission altogether. Therefore, it is desirable that the remaining inactive amplifiers have as high an output impedance as possible under such conditions when another amplifier is active.

In light of the above, it can be seen that an ideal amplifier would have an infinite output impedance when the amplifier is inactive. If it were possible to have an ideal system including a plurality of ideal amplifiers coupled to a single transmission line, the total number of amplifiers which may be coupled together would generally then be unlimited.

However, the output impedance of amplifiers do not behave in the above-described ideal manner. The output impedance during inactive operation is generally not infinite. Thus, the impedance of the back termination that an active amplifier drives is generally altered by the presence of the remaining amplifiers on the transmission line. This loading effect generally limits the number of amplifiers that can be coupled in parallel to a single transmission line.

In view of the foregoing, it would be desirable to provide a method for allowing the number of amplifiers coupled in parallel to a single transmission line to be increased.

It would also be desirable to provide a method and circuit for increasing the output impedance of an inactive amplifier for use in distributing video and other electrical signals.

It would further be desirable to provide an amplifier having high output impedance in its inactive state that allows a plurality of such amplifiers to be coupled in parallel to a single transmission line with reduced signal degradation.

It would additionally be desirable to provide a system for coupling a plurality of amplifiers to a single transmission line wherein the feedback networks associated with each amplifier do not significantly load the transmission line.

SUMMARY OF THE INVENTION

It is therefore an object of the present invention to provide a method for allowing the number of amplifiers coupled in parallel to a single transmission line to be increased.

It is also an object of the present invention to provide a method and circuit for increasing the output impedance of an inactive amplifier for use in distributing video and other electrical signals.

It is a further object of the present invention to provide an amplifier having high output impedance in its inactive state that allows a plurality of such amplifiers to be coupled in parallel to a single transmission line with reduced signal degradation.

It is an additional object of the present invention to provide a system for coupling a plurality of amplifiers to a single transmission line wherein the feedback networks associated with each amplifier do not significantly load the transmission line.

In accordance with these and other objects of the invention, there is provided an amplifier circuit for use in a system for transmitting a plurality of signals through a transmission line. The amplifier circuit includes a buffer circuit coupled to drive the amplifier circuit's feedback network to increase the effective impedance of the feedback network. The buffer circuit can be selectively activated when the amplifier circuit is inactive (i.e., when it is in a non-amplifying state) to cause the amplifier circuit to have a high output impedance.

There is also provided a method for increasing the output impedance of an amplifier circuit for use in a system for transmitting a plurality of signals through a transmission line. The coupling of a circuit for driving the amplifier circuit's feedback network allows the effective impedance of the amplifier circuit's feedback network to be selectively increased to cause the effective impedance of the overall amplifier circuit to be increased during inactive periods.

The circuit and method of the present invention allow an increased number of amplifier circuits to be coupled in parallel to a single transmission without the disadvantages associated with inactive amplifier loading of the transmission line.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
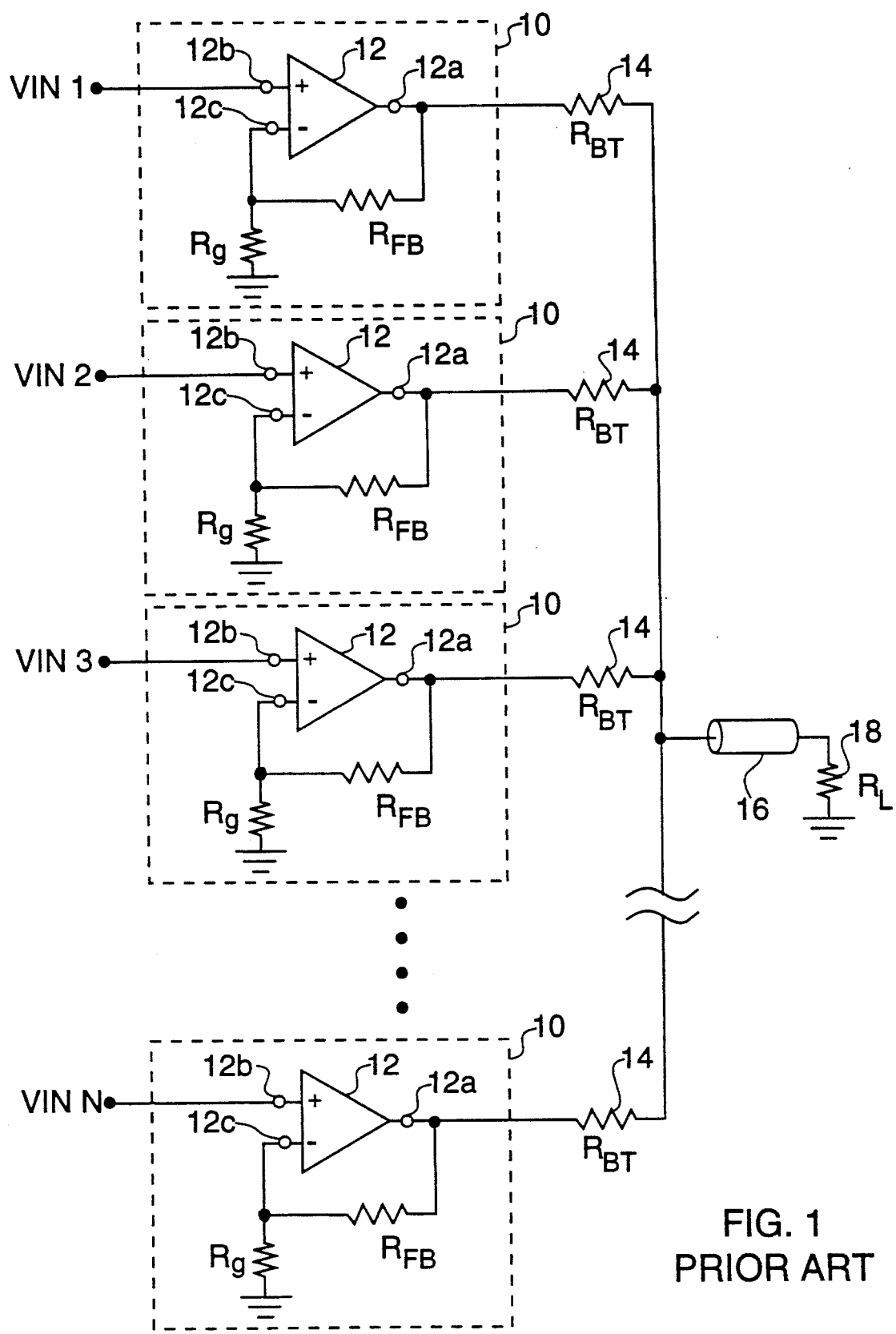
FIG. 1 is a schematic block diagram of a typical prior art system for transmitting a plurality of electrical signals through a single transmission line.

FIG. 1 is a schematic block diagram of a typical prior art system for transmitting a plurality of electrical signals through a single transmission line.

Each amplifier circuit 10 shown in FIG. 1 couples a respective video or other electrical signal (i.e., $V_{in1}$, $V_{in2}$, $V_{in3}$ and $V_{inN}$) to a common transmission line 16 (e.g., a coaxial cable or parallel conductors) for distribution to a remote load $R_L$ 18. Each amplifier circuit 10 typically includes amplifier 12 having inputs 12b and 12c and output 12a. The input electrical signals $V_{in1}$, $V_{in2}$, $V_{in3}$, and $V_{inN}$ are coupled to inputs 12b, while the outputs 12a are coupled to transmission line 16 through back-termination resistors $R_{BT}$ 14. Feedback is provided to each amplifier 12 through input 12c by way of feedback resistors $R_{FB}$ (which is coupled between output 12a and input 12c) and $R_g$ (which is also coupled to ground). Typically, amplifier 12 is a monolithic integrated circuit whereas feedback resistors $R_{FB}$ and $R_g$ are discrete external resistors having a resistance chosen by the user to accommodate a particular application.

As shown in FIG. 1, a plurality of amplifier circuits 10 may be coupled in parallel for transmitting a plurality of electrical signals through transmission line 16. However, as discussed above, as the number of amplifier circuits 10 increases (i.e., as N gets larger), the loading of transmission line 16 will also increase due to the finite output resistances of amplifier circuits 10 in their inactive states. (As used herein, the phrase "inactive state" is defined to mean a state of an amplifier wherein the amplifier does not perform it's intended function of amplifying an input signal to produce an output signal.)

In some prior art systems, to address the above loading effect, all amplifiers 12 are selectively turned OFF (i.e., powered down) except for the particular amplifier transmitting a signal. Thus, at any given time, only one amplifier 12 will be activated while the remaining inactive amplifiers will be powered down. If the output impedance in the powered down state is higher than the output impedance in the active state, then the loading effects of the inactive amplifiers may be reduced.

Although the above method can reduce the loading effects associated with a single transmission line, it generally suffers from two disadvantages.

First, during periods of time when the active amplifier generates a high dv/dt at its output, such voltages may couple through stray capacitances to the powered-down amplifiers. In some situations the coupling is strong enough to generate differential voltages which are large enough to turn ON the powered-down amplifiers. Such unintentional turning-ON can create undesirable transient loading effects.

Second, although amplifiers 12 shown in FIG. 1 may be powered down when they are not in use, this method does not compensate for the loading effect of the feedback network (i.e., resistors $R_{FB}$ and $R_g$) which directly loads the back termination of transmission line 16.

Figure 2:
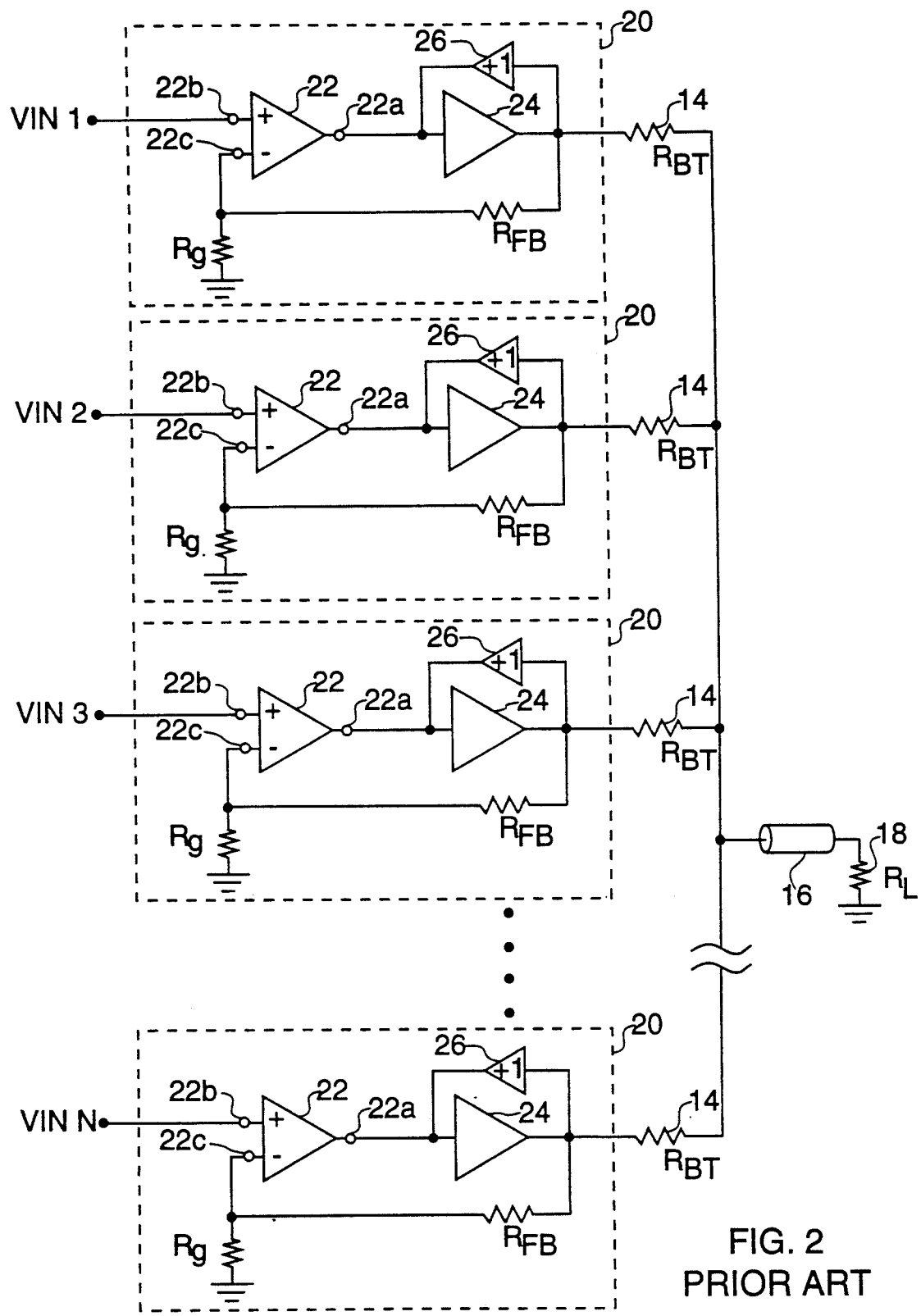
FIG. 2 is a schematic block diagram of another typical prior art system for transmitting a plurality of electrical signals through a single transmission line.

FIG. 2 is a schematic block diagram of another typical prior art system for transmitting a plurality of electrical signals through a single transmission line. In contrast to the system of FIG. 1, the system of FIG. 2 includes a plurality of amplifiers that are adapted to prevent the above-discussed unintentional and undesirable turning-ON of powered-down amplifiers during the generation of high output dv/dt's.

Each amplifier 20 of FIG. 2 includes an input circuit 22, having inputs 22b and 22c and an output 22a, that is used to drive a corresponding output buffer 24. Coupled across each output buffer 24 is an additional buffer 26 (e.g., a unity-gain buffer) for actively maintaining the output buffer 24 in a high impedance state while the overall amplifier circuit is inactive. Buffers 26 reduce the effects of stray capacitance at the inputs of output buffers 24 which may otherwise allow transient loading of the transmission line due to differential voltage generation as discussed above. Buffers 26 are actively maintained ON while their associated amplifier circuits 20 are inactive, and are otherwise maintained OFF.

Although the system of FIG. 2 overcomes the transient loading effect discussed above, it still suffers from the disadvantage that the system does not compensate for the loading effects of the feedback network (i.e., resistors $R_{FB}$ and $R_g$). These resistors directly load the back termination of transmission line 16 independent of whether or not output buffers 24 are actively maintained in a high impedance state.

For example, even if Buffers 26 shown in FIG. 2 are able to increase the output impedance of the individual output buffer 24 to a resistance in excess of 100 kohms, the combination of this resistance with resistors $R_{FB}$ and $R_g$ (which typically are about one kohm each) will still load the transmission line and back-termination resistor with a resistance of two kohms. Thus, although the output buffers 24 of FIG. 2 are able to be maintained in a high impedance state during inactive operation, the amplifier circuits 20, as a whole, do not address the loading effects associated with the feedback network. As the number of amplifier circuits increase, the presence of their associated feedback networks further load the back termination of the transmission line.

Figure 3:
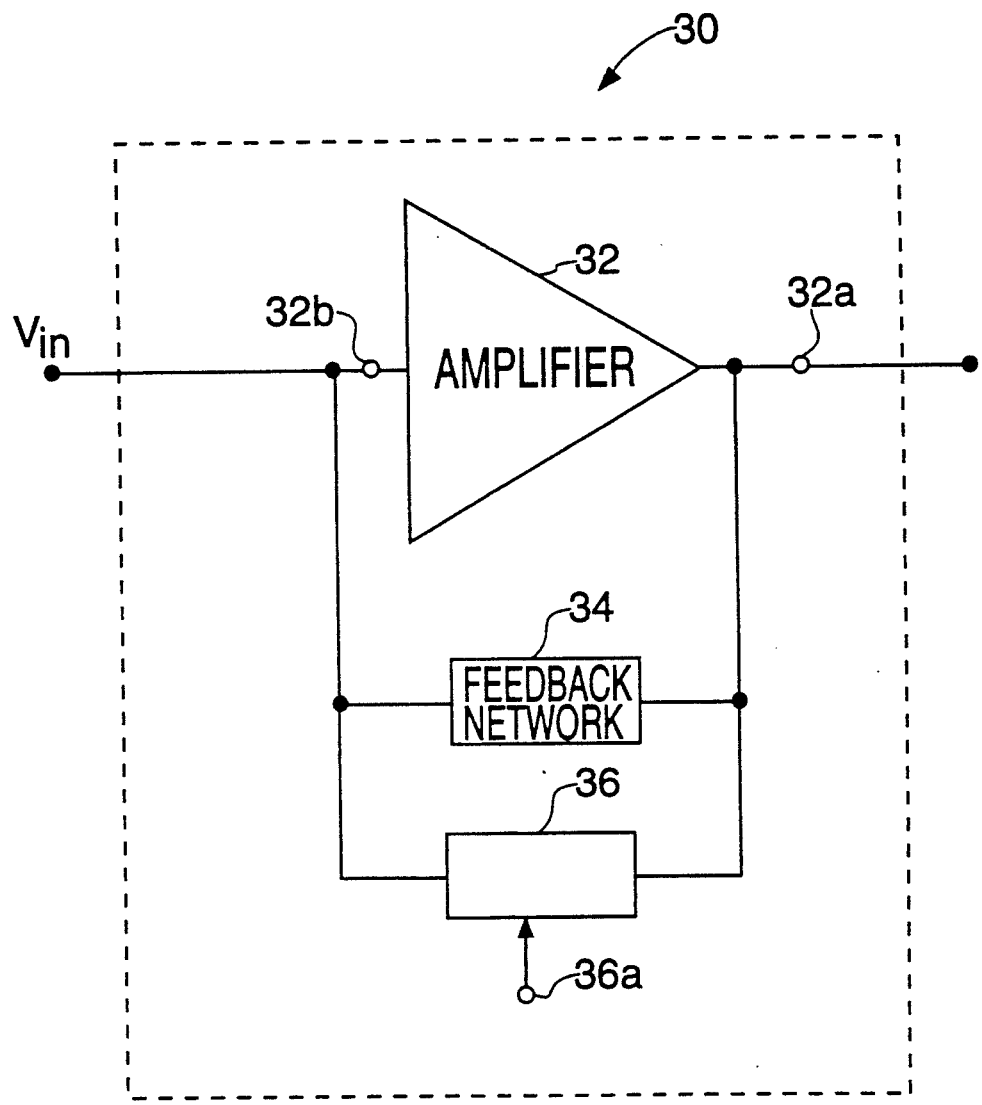
FIG. 3 is a schematic block diagram of an embodiment of an amplifier circuit incorporating principles of the present invention to increase the amplifier circuits output impedance in the inactive state.

FIG. 3 is a schematic block diagram of an amplifier circuit incorporating principles of the present invention to increase the amplifier circuits output impedance in its inactive state. The amplifier shown in FIG. 3 reduces the loading effects associated with a feedback network on a transmission line.

Amplifier circuit 30 shown in FIG. 3 includes amplifier 32 having an output 32a for coupling to a transmission line (not shown). Amplifier circuit 30 also includes feedback network 34 coupled between output 32a and input 32b for providing feedback therebetween. Feedback network 34 monitors output 32a to generate a feedback signal to the control the output signal from output 32a. Such feedback could be in the form of either current or voltage feedback. Also coupled between output 32a and input 32b, and across feedback network 34, is circuit 36 for driving the feedback network when the amplifier circuit is in a non-amplifying state to increase the effective impedance of the network and, thus, amplifier circuit 30. Circuit 36 includes control input 36a for activating circuit 36 during such operation. Amplifier circuit 30 works as follows.

During active operation while amplifier circuit 30 amplifies and couples the received input signal $V_{in}$ from input 32b to output 32a, control input 36a is used to deactivate circuit 36 so that circuit 36 does not substantially interfere with the operation of amplifier circuit 30 and, in particular, feedback network 34. In other words, during active operation, amplifier circuit 30 operates in a conventional manner with amplifier 32 employing feedback network 34 for providing feedback between output 32a and input 32b. Circuit 36 is intended to not substantially alter such operation.

During inactive periods when a user desires to have the output impedance of amplifier circuit 30 increased to reduce its loading effect on a transmission line—and, in particular, the loading effect of feedback network 34—, amplifier 32 is accordingly deactivated and control input 36a is used to activate circuit 36. Circuit 36 is used to drive feedback network 34 and, therefore, increase the effective impedance of feedback network 34 so that the total output impedance of amplifier circuit 30 is increased relative to a circuit not including circuit 36. Thus, using the method of the present invention, the loading effect of the feedback network 34 on a transmission line can be reduced. The method therefore allows an increased number of amplifier circuits to be coupled in parallel to a common transmission line.

Figure 4:
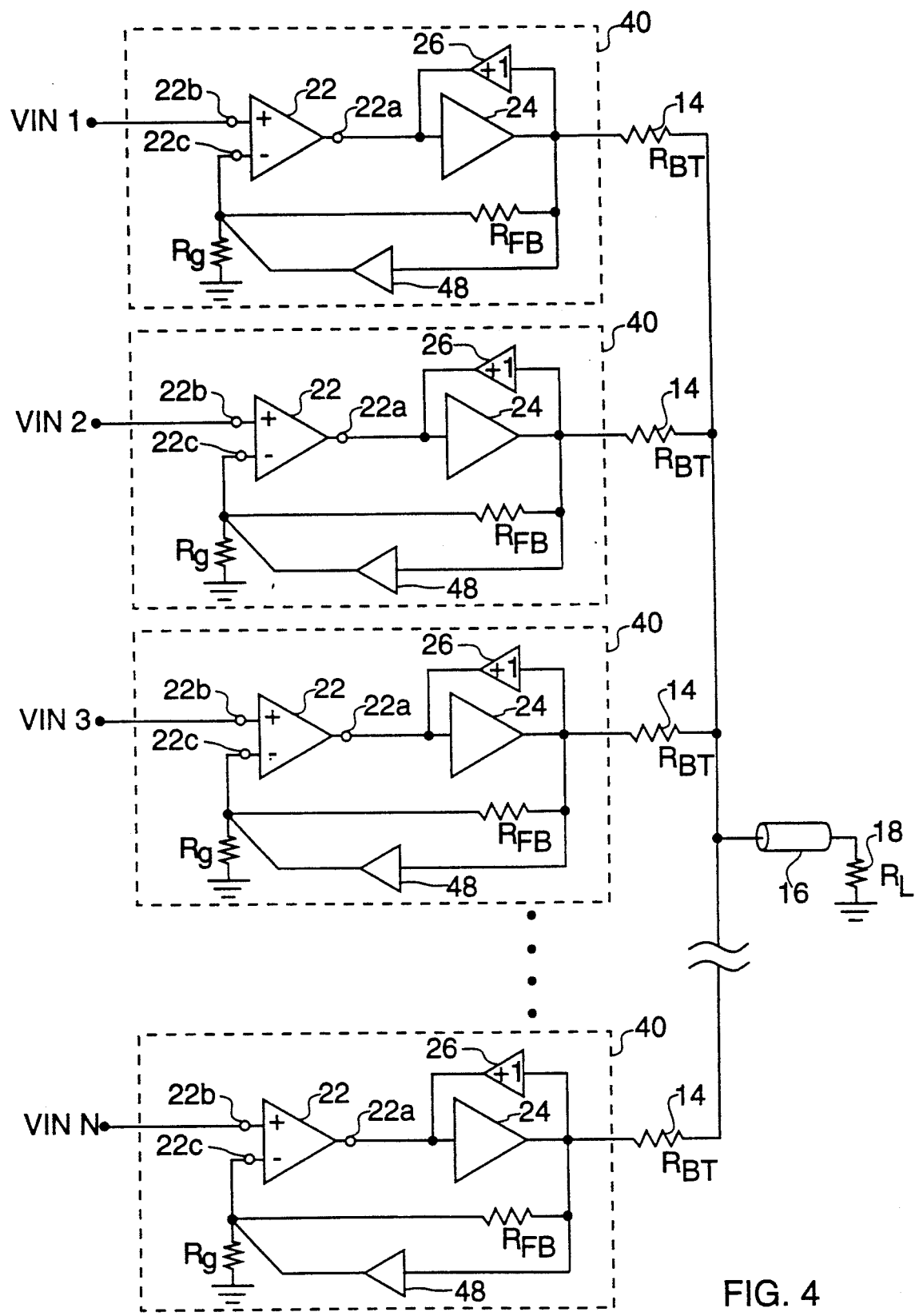
FIG. 4 is a schematic block diagram of a first embodiment of a system employing the present invention for use in transmitting a plurality of electrical signals through a single transmission line.

FIG. 4 is a schematic block diagram of a first embodiment of a system employing the present invention for use in transmitting a plurality of electrical signals through a single transmission line.

Each amplifier circuit 40 shown in FIG. 4 includes input circuit 22, output buffer 24, and buffer 26 as discussed above with respect to FIG. 2. In addition, each amplifier circuit 40 includes an additional buffer 48 (e.g., a unity-gain buffer) coupled across feedback resistor $R_{FB}$, from the output of buffer 24 to inverting input 22c, for driving feedback resistor $R_{FB}$ and, therefore, for selectively increasing the impedance of amplifier circuit 40 during periods when the circuit is inactive. In particular, buffer 48 drives node 22c and, therefore, increases the effective impedance of feedback resistor $R_{FB}$ according to the following equation:

$$R_{EFF} = R_{FB}/(1 - A_v)$$

where $A_V$ is the gain of buffer 48. The closer the gain of buffer 48 to unity, the larger the effective impedance will be. Thus for gain values in excess of $+0.9$, the effective impedance of feedback resistor $R_{FB}$ can be increased by at least an order of magnitude by actively driving the feedback resistor.

In accordance with the present invention, buffer 48 is a non-inverting amplifier (i.e., an amplifier having a positive gain value) capable of driving the feedback network to increase the effective impedance of the network. Preferably, buffer 48 has a gain value greater than zero and less than about two. More preferably, buffer 48 has a gain value of about one (i.e., unity gain).

Figure 5:
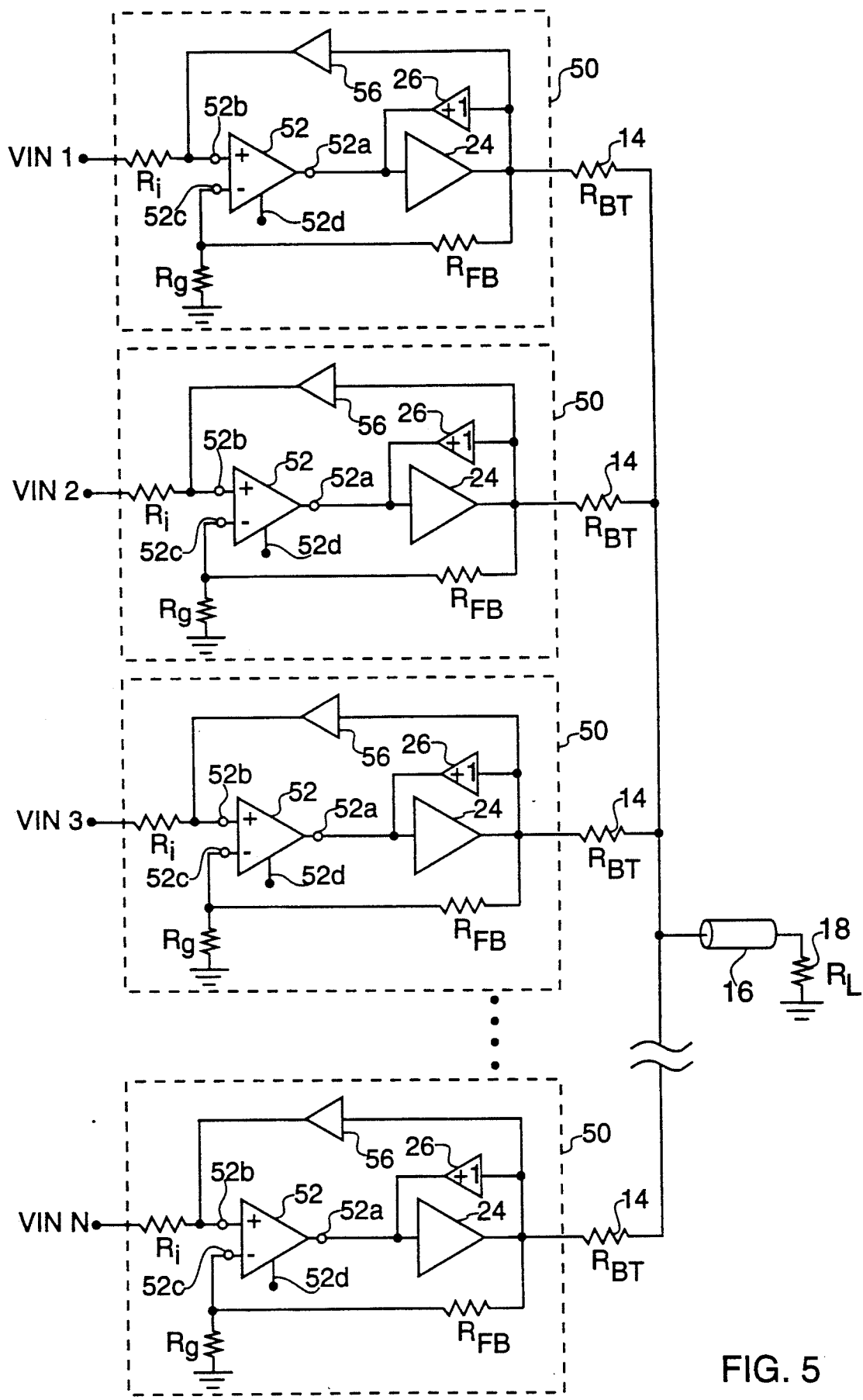
FIG. 5 is a schematic block diagram of a second embodiment of a system employing the present invention for use in transmitting a plurality of electrical signals through a single transmission line.

Although the amplifier circuits illustrated in FIG. 4 show buffers 48 as coupled directly across feedback resistors $R_{FB}$ to drive and, therefore, increase the effective impedance of those resistors, there are other embodiments of the present invention for providing the same effect. For example, FIG. 5 illustrates another such embodiment. FIG. 5 is a schematic block diagram of a second embodiment of a system employing the present invention for use in transmitting a plurality of electrical signals through a single transmission line.

Each amplifier circuit 50 shown in FIG. 5 includes output buffer 24 and buffer 26 similar to those in the amplifier circuits of FIGS. 2 and 4. Output buffers 24 are driven by input circuits 52 having an output 52a and a control input 52d for accepting a logic signal indicative of whether or not the amplifier circuit 50 is intended to be activated. Circuits 50 also includes an additional buffer 56 (e.g., a unity-gain buffer) for increasing the output impedance of amplifier circuit 50 in the inactive state as discussed above with respect to FIG. 4. Amplifier circuit 50 works as follows.

During active operation, input circuit 52 operates similar to input circuit 22 of FIG. 4. Buffers 26 and 56 are deactivated to allow amplifier circuit 50 to operate in a conventional manner with feedback through feedback resistors $R_{FB}$ and $R_g$.

During inactive operation, buffer 56 is activated to drive the non-inverting input 52b of input circuit 52. Resistors Ri (e.g., one kohm) are used to couple such driving to input circuit 52. In turn, input circuit 52 is used to further drive the inverting input 52c coupled to feedback resistor $R_{FB}$. In other words, the internal drivers of input circuit 52 (not shown in FIG. 5) are used to couple the non-inverting input 52b to the inverting input 52b so as to allow buffer 56 to drive feedback resistor $R_{FB}$. Such coupling will have a similar effect on increasing the effective impedance of the feedback resistor $R_{FB}$ as is the case in FIG. 4 (where a buffer is directly coupled across the feedback resistor to drive the feedback resistor).

The embodiment of the amplifier circuits shown in FIG. 5 have particular advantages over the embodiment shown in FIG. 4 in certain circuit configurations. For example, in current feedback topologies wherein the input circuits 22 employ current feedback, the input circuits 22 are generally sensitive to stray capacitances. Such stray capacitances can create instability or oscillation in the amplifier circuit during active operation in some situations. Thus, if buffers 48 in FIG. 4 are required to have fairly large transistors to drive a low-valued $R_g$ coupled from inputs 22c to ground, the large capacitances associated with those transistors may add to the stray capacitance at inputs 22c. Therefore, particular account may have to be made of such stray capacitances if the amplifier circuits of FIG. 4 are designed with a current feedback topology.

The amplifier circuits of FIG. 5 reduce the effects of such stray capacitances if current feedback is used. This feature of the embodiment of the circuits of FIG. 5 is due to the dual purpose use of the driver transistors in input circuits 52. Those drivers are used both during active operation and during inactive operation to assist in driving the non-inverting inputs coupled to the feedback resistors $R_{FB}$. Because the drivers of input circuits 52 are also used for inactive operation, the stray-capacitance effects associated with some current feedback topologies can be reduced with the system shown in FIG. 5.

Figure 6:
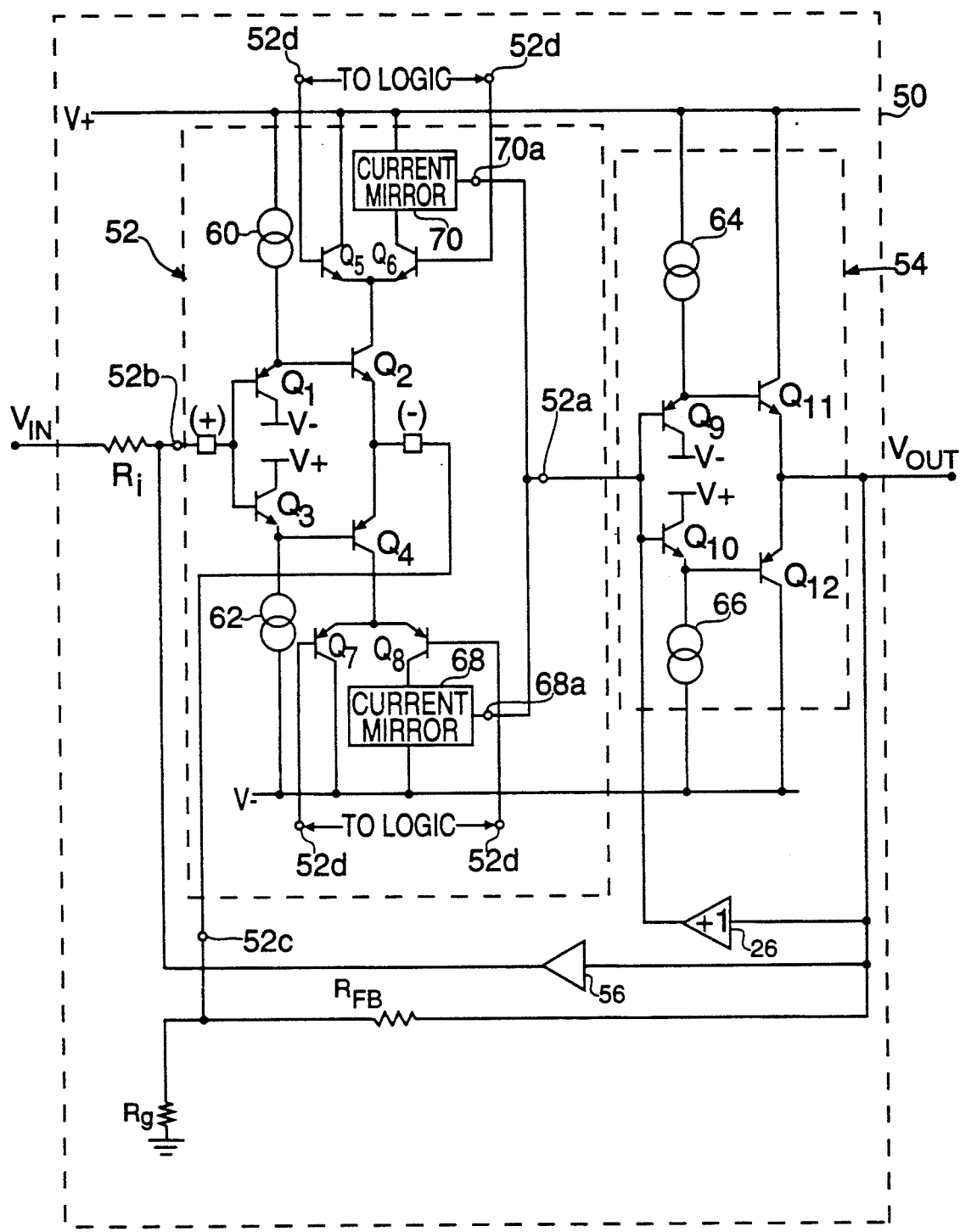
FIG. 6 is a detailed schematic diagram of a preferred embodiment of the amplifiers shown in FIG. 5.

FIG. 6 is a detailed schematic diagram of a preferred embodiment of amplifier circuit 50 of FIG. 5. Amplifier circuit 50 shown in FIG. 5 includes input circuit 52 and output buffer 54 as described below.

Input circuit 52 includes eight bipolar junction transistors (Q1-Q8), current sources 60 and 62 and current mirror circuits 68 and 70. In accordance with the present invention, input circuit 52 is used during both active and inactive periods of amplifier operation to drive the feedback network.

During active operation, transistors Q1, Q2, Q3, Q4, Q6 and Q8 form a differential amplifier having inputs 52b and 52c and an output 52a taken from the pair of outputs 68a and 70a of current mirror circuits 68 and 70, respectively. During inactive operation, transistors Q6 and Q8 are switched out of operation and replaced with transistors Q5 and Q7, respectively. Such switching allows transistors Q1, Q2, Q3, Q4, Q5 and Q7 to form a buffer circuit with an input at node 52b and an output at node 52c. Thus, the driver transistors of input circuit 52 are used to form both a differential amplifier (during active operation) and a buffer circuit (during inactive operation).

As shown in FIG. 6, input circuit 52 and output buffer 54 are interconnected as follows. The bases of transistors Q1 and Q3 are commonly coupled together and to input 52b, while their collectors are coupled to supply rails V− and V+, respectively. The emitter of transistor Q1 is coupled to supply rail V+ through current source 60 and also coupled to the base of transistor Q2, while the emitter of transistor Q3 is coupled to supply rail V− through current source 62 and also coupled to the base of transistor Q4. The emitters of transistors Q2 and Q4 are commonly coupled together and to input 52c.

The bases of transistors Q5 and Q6 are coupled to a control logic circuit (not shown), while their emitters are coupled to each other and to the collector of transistor Q2. The collectors of transistors Q5 and Q6 are coupled to V+, but the collector of transistor Q6 goes through current mirror 70 which provides half of output 52a for input circuit 52. Transistors Q7 and Q8, current mirror 68, and transistor Q4 are similarly coupled to form the other half of output 52a for input circuit 52.

Output buffer 54 of amplifier 50 comprises four transistors (Q9-Q12) and two current sources (64 and 66). The bases of transistors Q9 and Q10 are coupled to each other and to output 52a which provides an input signal to buffer 54, while their collectors are coupled to V− and V+, respectively. The emitter of transistor Q9 is coupled to V+ through current source 64 and also coupled to the base of transistor Q11. The emitter of transistor Q10 is similarly coupled to V− through current source 66 and also to the base of transistor Q12. The collectors of transistors Q11 and Q12 are coupled to V+ and V− respectively, while their emitters are coupled together to form the output of amplifier 50.

The output of amplifier 50 is coupled to the inputs of buffers 26 and 56 as well as one side of feedback resistor $R_{FB}$. The other side of feedback resistor $R_{FB}$ is coupled to input 52c and resistor $R_g$ which is coupled to ground. The output of buffer 26 is coupled to the node formed between input circuit 52 and output buffer 54, while the output of buffer 56 is coupled to input 52b.

During active operation, amplifier 50 couples and amplifies the input signal from $V_{in}$ to $V_{out}$. During inactive operation, output buffer 54 is turned OFF and maintained at a high impedance by buffer circuit 26, while input circuit 52 is used in conjunction with buffer circuit 56 to increase the effective impedance of the feedback resistor $R_{FB}$. During both modes of operation, transistors Q1-Q4 will be turned on.

When amplifier 50 is active, transistors Q5 and Q7 are turned off, transistors Q6 and Q8 are turned on, and buffers 26 and 56 are turned off (by the control logic—not shown). The input signal at $V_{in}$ passes through the amplifier formed by transistors Q1-Q4 and into current mirrors 68 and 70, where the output signal is provided at output 52a. The output signal passes through output buffer 54 to $V_{out}$ into the transmission line (normally through a back-termination resistor—not shown).

When amplifier 50 is inactive, transistors Q5 and Q7 are turned on, transistors Q6 and Q8 are turned off, and buffers 26 and 56 are turned on (by the control logic—not shown). Turning off transistors Q6 and Q8 prevents any signal currents in input circuit 52 from passing to output buffer 54. As previously described, buffer 26 ensures that the output buffer remains inactive and in a high-impedance state. Buffer circuit 56 is used to drive input 52b. The signal at input 52b passes through the amplifier formed from transistors Q1-Q4 to drive the negative input 52c of input circuit 52. By thus adequately driving the negative input with the internal drivers of input circuit 52, input circuit 52 in conjunction with buffer circuit 56 "bootstraps" resistor $R_{FB}$ and raises the effective impedance of resistor $R_{FB}$ to reduce the loading of an inactive amplifier 50 on the transmission line.

Preferably, input circuit 52, output buffer 54, buffer 26 and buffer 56 are monolithically integrated into a single integrated circuit while resistors $R_{FB}$ and $R_g$ are discrete components. Such an embodiment of the present invention allows a user to choose the resistance values for resistors $R_{FB}$ and $R_g$ depending upon the particular intended application.

FIG. 6 illustrates that although FIG. 3 shows the amplifier circuit of the present invention as comprising three separate components (i.e., amplifier 32, feedback network 34 and circuit 36), such components do not have to be separate if a particular component can make use of circuitry in another component. For example, circuit 36 shown in FIG. 3 can use circuit components of amplifier 32 if such components assist in increasing the effective impedance of the feedback network 34. This is shown in FIG. 6 where the driver transistors of input circuit 52 are used both during active and inactive operation to assist in driving the feedback network.

Figure 7:
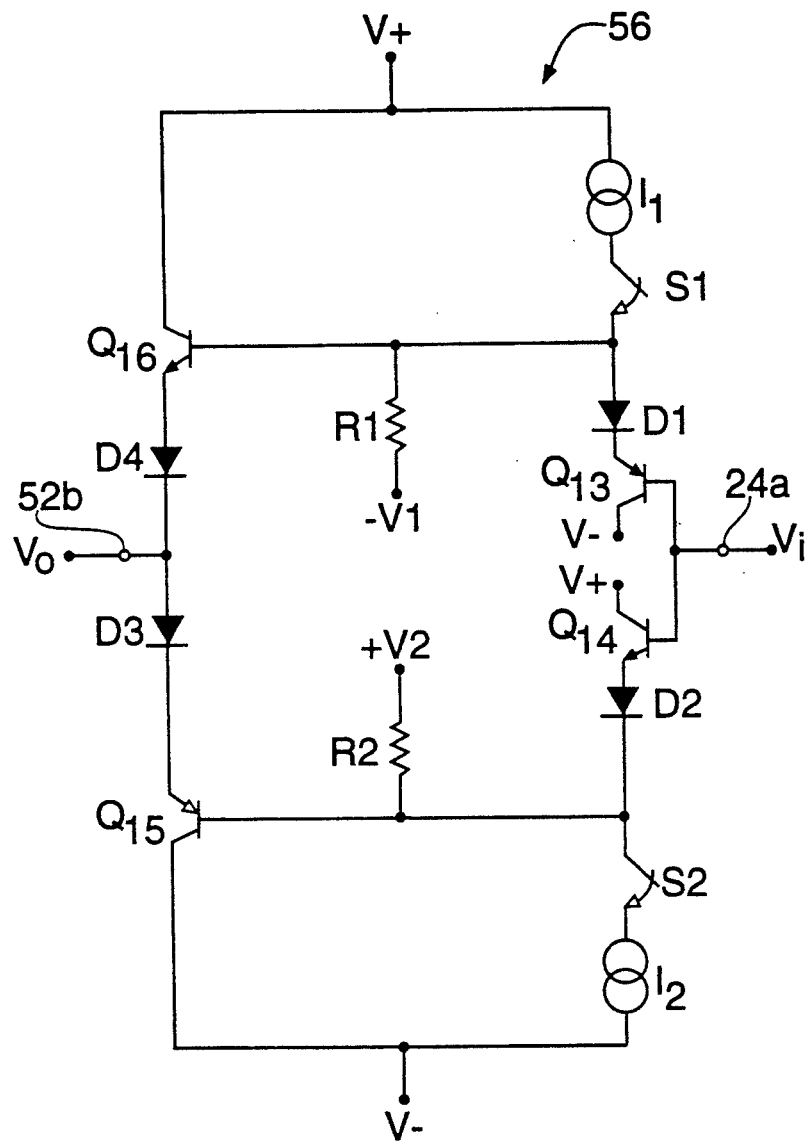
FIG. 7 is a detailed schematic diagram of a preferred embodiment of the buffers 56 shown in FIG. 6.

FIG. 7 is a detailed schematic diagram of a preferred embodiment of buffer circuits 56 shown in FIG. 6.

Buffer circuit 56 includes four transistors (Q13-Q16), four diodes (D1-D4), two current source (I1 and I2), two switches (S1 and S2) and two resistors (R1 and R2). Buffer circuit 56 works as follows.

Transistors Q13 and Q14, current sources I1 and I2, switches S1 and S2 (which may be conventional current steering transistors) and diodes D1 and D2 form an emitter-follower input stage. During active operation, switches S1 and S2 are closed, diodes D1 and D2 are forward biased and Vi at input 24a is coupled to the bases of transistors Q15 and Q16 which form an output stage. Diodes D3 and D4, which are coupled to the emitters of transistors Q15 and Q16, respectively, are also forward-biased so as to allow the input Vi to couple to output Vo at node 52b.

During active operation, the Vbe losses across input transistors Q13 and Q14 will be compensated by the Vbe gains across output transistors Q15 and Q16. Resistors R1 and R2 (coupled to the bases of transistors Q16 and Q15, respectively) have a large enough resistance to prevent significant current loss therethrough during active operation.

During inactive operation, switches S1 and S2 are opened and resistors R1 and R2 are used to reverse bias diodes D1-D4 and transistors Q13-Q16 to reduce the capacitance from Vi (node 24a) to Vo (node 52b). Transistors Q13-Q16 are preferably chosen to have substantially equal sizes and to be as small as possible to further minimize any junction capacitances during inactive operation. Voltage sources $-V1$ and $+V2$ (which are always maintained ON) are chosen to have voltages large enough to facilitate the reverse biasing, but small enough to prevent reverse bias junction breakdown of diodes D1-D4 and transistors Q13-Q16.

Although the embodiments of the amplifier circuits shown in FIGS. 4 and 5 show the input signal (e.g., $V_{in1}$, $V_{in2}$, $V_{in3}$, and $V_{inN}$) as being coupled to each amplifier 22 and 52 through the non-inverting inputs 22a and 52a, respectively (i.e., in "non-inverting" topologies), this does not have to be the case. In particular, the amplifier circuits of the present invention could just as well employ amplifiers 22 and 52 in "inverting" topologies. For example, instead of coupling the input signal to non-inverting inputs 22a and 52a as shown in FIGS. 4 and 5, respectively, the input signal could instead be coupled to inverting inputs 22c and 52c through resistor $R_g$. Of course, in such "inverting" topologies, non-inverting inputs 22a and 52a would then be coupled to ground.

Furthermore, although the embodiments of the amplifier circuits shown in FIGS. 3-7 show only one input signal (e.g., $V_{in1}$, $V_{in2}$, $V_{in3}$, and $V_{inN}$) coupled to each amplifier circuit, this does not have to be the case. For example, the amplifier circuit of the present invention can be fed by an output taken from a multiplexer circuit. Such a multiplexer circuit, in turn, could be used to switch a plurality of signals so that a single amplifier circuit, in combination with a multiplexer circuit, can be used to selectively couple a plurality of signals to a transmission line. This feature of the present invention allows larger switching matrices to be coupled to a single transmission line.

Thus, a method and circuit for increasing the output impedance in an inactive amplifier has been provided. The amplifier of the present invention allows a plurality of such amplifiers to be coupled in parallel to a single transmission line for transmitting a plurality of video or other electrical signals to a remote location with reduced transmission line loading effects.

One skilled in the art will appreciate that the present invention can be practiced by other than the described embodiments, which are presented for purposes of illustration and not of limitation, and the present invention is limited only by the claims which follow.

What is claimed is:

1. An amplifier circuit having at least one input for receiving an input signal, an output for producing an output signal when the amplifying circuit is in an amplifying state, the amplifier circuit adapted to be coupled to a feedback network which monitors the output signal to generate a feedback signal to control the output during the amplifying state, the amplifier circuit comprising:
   a first amplifier for receiving the input signal and for producing the output signal; and
   a circuit coupled to drive the feedback network when the amplifier circuit is in a non-amplifying state to increase the effective impedance of the network, whereby the output impedance of the amplifier circuit is increased during said non-amplifying state.

2. The amplifier circuit of claim 1 wherein the driving circuit is coupled to the output to increase the effective impedance of the network.

3. The amplifier circuit of claim 2 wherein:
   the amplifier circuit includes a first input for coupling to a first node which receives said input signal and a second input for coupling to a second node which receives said feedback signal; and
   said feedback network includes:
      a first resistor coupled between said output and said second input; and
      a second resistor coupled between said second input and a ground.

4. The amplifier circuit of claim 3 wherein the driving circuit includes a buffer circuit for driving the feedback network, the buffer circuit comprising a non-inverting amplifier.

5. The amplifier circuit of claim 4, wherein the non-inverting amplifier has a gain greater than zero and less than about two.

6. The amplifier circuit of claim 5, wherein the non-inverting amplifier has a gain of about unity.

7. The amplifier circuit of claim 5, wherein the first amplifier and driving circuit are monolithically integrated into a single integrated circuit and wherein the feedback network comprises at least one discrete component.

8. The amplifier circuit of claim 7, wherein the buffer circuit is coupled between said output and said second input.

9. The amplifier circuit of claim 7, wherein the buffer circuit is coupled between said output and said first input.

10. The amplifier circuit of claim 9, wherein said first amplifier includes an input circuit for (1) amplifying during said amplifying state and (2) driving said feedback network through said second input during said non-amplifying state.

11. The amplifier circuit of claim 2 wherein:
   the amplifier circuit includes a first input for coupling to ground and a second input; and
   said feedback network includes:
      a first resistor coupled between said output and said second input; and
      a second resistor coupled between said second input and a node which receives the input signal.

12. The amplifier circuit of claim 11 wherein the driving circuit includes a buffer circuit for driving the feedback network, the buffer circuit comprising a non-inverting amplifier.

13. The amplifier circuit of claim 12, wherein the non-inverting amplifier has a gain greater than zero and less than about two.

14. The amplifier circuit of claim 13, wherein the non-inverting amplifier has a gain of about unity.

15. The amplifier circuit of claim 13, wherein the first amplifier and driving circuit are monolithically integrated into a single integrated circuit and wherein the feedback network comprises at least one discrete component.

16. The amplifier circuit of claim 15, wherein the buffer circuit is coupled between said output and said second input.

17. A method for increasing the output impedance of an amplifier circuit, the amplifier circuit including at least one input for receiving an input signal, an output for producing an output signal when the amplifying circuit is in an amplifying state, and a first amplifier for receiving the input signal and for producing the output signal, the amplifier circuit adapted to be coupled to a feedback network which monitors the output signal to generate a feedback signal to control the output during the amplifying state, the method comprising the steps of:
   (a) deactivating the first amplifier to put said amplifier circuit into a non-amplifying state; and
   (b) driving the feedback network when the amplifier circuit is in the non-amplifying state to increase the effective impedance of the network.

18. The method of claim 17 wherein:
   the input of said amplifier circuit includes a first input for coupling to a first node which receives said input signal and a second input for coupling to a second node which receives said feedback signal; and
   the feedback network includes:
      a first resistor coupled between said output and said second input; and
      a second resistor coupled between said second input and a ground.

19. The method of claim 18 wherein step (b) includes driving said feedback network with a buffer circuit comprising a non-inverting amplifier.

20. The method of claim 19, wherein the non-inverting amplifier has a gain greater than zero and less than about two.

21. The method of claim 20, wherein the non-inverting amplifier has a gain of about unity.

22. The method of claim 20, wherein the buffer circuit is coupled between said output and said second input.

23. The method of claim 20, wherein the buffer circuit is coupled between said output and said first input.

24. The method of claim 23, wherein the first amplifier includes an input circuit for (1) amplifying during said amplifying state and (2) driving said feedback network through said second input during said non-amplifying state.

25. The method of claim 17 wherein:
   the input of said amplifier circuit includes a first input for coupling to ground and a second input; and
   the feedback network includes:
      a first resistor coupled between said output and said second input; and
      a second resistor coupled between said second input and a node which receives the input signal.

26. The method of claim 25 wherein step (b) includes driving said feedback network with a buffer circuit comprising a non-inverting amplifier.

27. The method of claim 26, wherein the non-inverting amplifier has a gain greater than zero and less than about two.

28. The method of claim 27, wherein the non-inverting amplifier has a gain of about unity.

29. The method of claim 27, wherein the buffer circuit is coupled between said output and said second input.

30. An amplifier circuit having at least one input for receiving an input signal, an output for producing an output signal when the amplifying circuit is in an amplifying state, the amplifier circuit adapted to be coupled to a feedback means which monitors the output signal to generate a feedback signal to control the output during the amplifying state, the amplifier circuit comprising:
   means for receiving and amplifying the input signal to produce an amplified output signal; and
   means coupled for driving at least a portion of the feedback means when the amplifier circuit is in a non-amplifying state to increase the effective output impedance of the network,
   whereby the output impedance of the amplifier circuit is increased during said non-amplifying state.

31. The amplifier circuit of claim 30 wherein the driving means is coupled to the output to increase the effective impedance of the network.

32. The amplifier circuit of claim 31 wherein:
   the amplifier circuit includes a first input for coupling to a first node which receives said input signal and a second input for coupling to a second node which receives said feedback signal; and
   said feedback means includes:
      a first resistance means coupled between said output and said second input; and
      a second resistance means coupled between said second input and a ground.

33. The amplifier circuit of claim 32 wherein the driving means includes a buffer means for driving the feedback network, the buffer means comprising a non-inverting amplifier.

34. The amplifier circuit of claim 33, wherein the non-inverting amplifier has a gain greater than zero and less than about two.

35. The amplifier circuit of claim 34, wherein the non-inverting amplifier has a gain of about unity.

36. The amplifier circuit of claim 34, wherein the means for receiving and amplifying and the driving means are monolithically integrated into a single integrated circuit and wherein the feedback means comprises at least one discrete component.

37. The amplifier circuit of claim 36, wherein the buffer means is coupled between said output and said second input.

38. The amplifier circuit of claim 36, wherein the buffer means is coupled between said output and said first input.

39. The amplifier circuit of claim 38, wherein said means for receiving and amplifying includes a means for (1) amplifying during said amplifying state and (2) driving said feedback means through said second input during said non-amplifying state.

40. The amplifier circuit of claim 31 wherein:
   the amplifier circuit includes a first input for coupling ground and a second input; and
   said feedback means includes:

a first resistance means coupled between said output and said second input; and a second resistance means coupled between said second input and a node which receives the input signal.

41. The amplifier circuit of claim 40 wherein the driving means includes a buffer means for driving the feedback network, the buffer means comprising a non-inverting amplifier.

42. The amplifier circuit of claim 41, wherein the non-inverting amplifier has a gain greater than zero and less than about two.

43. The amplifier circuit of claim 42, wherein the non-inverting amplifier has a gain of about unity.

44. The amplifier circuit of claim 42, wherein the means for receiving and amplifying and the driving means are monolithically integrated into a single integrated circuit and wherein the feedback means comprises at least one discrete component.

45. The amplifier circuit of claim 44, wherein the buffer means is coupled between said output and said second input.

46. An amplifier circuit having at least one input for receiving an input signal, an output for producing an output signal when the amplifying circuit is in an amplifying state, the amplifier circuit adapted to be coupled to a feedback network which monitors the output signal to generate a feedback signal to control the output during the amplifying state, the amplifier circuit comprising:

a first amplifier for receiving the input signal and for producing the output signal, the first amplifier including:

an input circuit for amplifying the input signal and having an inverting input and a non-inverting input, wherein the input signal is adapted to be coupled to one of said inverting input and non-inverting input; and a first buffer circuit for isolating said input circuit from said output and having a first buffer input and a first buffer output; and a circuit coupled to drive the feedback network when the amplifier circuit is in a non-amplifying state to increase the effective impedance of the network, whereby the output impedance of the amplifier circuit is increased during said non-amplifying state.

47. The amplifier circuit of claim 46, wherein the first amplifier and driving circuit are monolithically integrated into a single integrated circuit and wherein the feedback network comprises at least one discrete component.

48. The amplifier circuit of claim 47, wherein the feedback network comprises:

a first resistor coupled between said output and said inverting input; and a second resistor coupled between said inverting input and one of a node which receives said input signal and a ground.

49. The amplifier circuit of claim 48, wherein:

the non-inverting input is adapted to be coupled to said node which receives the input signal; and the second resistor is coupled between said inverting input and said ground.

50. The amplifier circuit of claim 49, wherein the driving circuit includes:

a second amplifier having a gain greater than zero and less than about two and coupled between said output and said inverting input.

51. The amplifier circuit of claim 49, wherein the driving circuit includes:

a second amplifier having a gain greater than zero and less than about two and coupled between said output and said non-inverting input.

52. The amplifier circuit of claim 50, wherein the first amplifier includes a third amplifier having a gain greater than zero and less than about two and coupled between said output and said first buffer input for increasing the output impedance of said first buffer circuit during the non-amplifying state.

53. The amplifier circuit of claim 51, wherein the first amplifier includes a third amplifier having a gain greater than zero and less than about two and coupled between said output and said first buffer input for increasing the output impedance of said first buffer circuit during the non-amplifying state.

54. The amplifier circuit of claim 51, wherein said input circuit comprises:

a differential amplifier having a pair of outputs;

a first circuit for preventing current in said input circuit from propagating to said first buffer circuit during said non-amplifying state, said first circuit having an input coupled to one of said pair of differential amplifier outputs; and a second circuit for preventing current in said input circuit from propagating to said first buffer circuit during said non-amplifying state, said second circuit having an input coupled to the other one of said pair of differential amplifier outputs.

55. The amplifier circuit of claim 54, wherein said differential amplifier comprises:

a first current source coupled to a first reference voltage;

a second current source coupled to a second reference voltage;

a first transistor having a base coupled to said non-inverting input, a collector coupled to said second reference voltage, and an emitter coupled to said first current source;

a second transistor having a base coupled to said emitter of said first transistor, a collector coupled to said first circuit, and an emitter coupled to said inverting input;

a third transistor having a base coupled to said non-inverting input, a collector coupled to said first reference voltage, and an emitter coupled to said second current source; and a fourth transistor having a base coupled to said emitter of said third transistor, a collector coupled to said second circuit, and an emitter coupled to said inverting input.

56. The amplifier circuit of claim 55, wherein said first circuit comprises:

a fifth transistor having a base adapted to be coupled to a control logic circuit, a collector coupled to said first reference voltage, and an emitter coupled to said collector of said second transistor;

a sixth transistor having a base adapted to be coupled to said control logic circuit, a collector, and an emitter coupled to said collector of said second transistor; and a first current mirror having a first input coupled to said first reference voltage, a second input coupled to said collector of said sixth transistor, and an output corresponding to an output of said first circuit.

57. The amplifier circuit of claim 56, wherein said second circuit comprises:
- a seventh transistor having a base adapted to be coupled to said control logic circuit, a collector coupled to said second reference voltage, and an emitter coupled to said collector of said fourth transistor;
- an eighth transistor having a base adapted to be coupled to said control logic circuit, a collector, and an emitter coupled to said collector of said fourth transistor; and
- a second current mirror having a first input coupled to said second reference voltage, a second input coupled to said collector of said eighth transistor, and an output corresponding to an output of said second circuit.

58. The amplifier circuit defined in claim 51 wherein said first buffer circuit comprises:
- a first current source coupled to a first reference voltage;
- a second current source coupled to a second reference voltage;
- a first transistor having a base coupled to said first buffer input, a collector coupled to said second reference voltage, and an emitter coupled to said first current source;
- a second transistor having a base coupled to said emitter of said first transistor, a collector coupled to said first reference voltage, and an emitter coupled to said first buffer output;
- a third transistor having a base coupled to said first buffer input, a collector coupled to said first reference voltage, and an emitter coupled to said second current source; and
- a fourth transistor having a base coupled to said emitter of said third transistor, a collector coupled to said second reference voltage, and an emitter coupled to said first buffer output.

59. An amplifier circuit having at least one input for receiving an input signal, an output for producing an output signal when the amplifying circuit is in an amplifying state, the amplifier circuit adapted to be coupled to a feedback network which monitors the output signal to generate a feedback signal to control the output during the amplifying state, the amplifier circuit comprising:
- a first amplifier for receiving the input signal and for producing the output signal; and
- a first circuit for increasing the effective impedance of the feedback network when the amplifier circuit is in a non-amplifying state, wherein the first amplifier and the first circuit are monolithically integrated into a single integrated circuit, whereby the output impedance of the amplifier circuit is increased during said non-amplifying state.

60. The amplifier circuit of claim 59 wherein the feedback network includes at least one discrete component.

61. The amplifier circuit of claim 60 wherein:
the amplifier circuit includes a non-inverting input and an inverting input; and
said feedback network includes:
- a first resistor coupled between said output and said inverting input; and
- a second resistor coupled between said inverting input and one of a node which receives said input signal and a ground.

62. The amplifier circuit of claim 61 wherein the first circuit including a buffer circuit comprising a non-inverting amplifier.

63. The amplifier circuit of claim 62, wherein the non-inverting amplifier has a gain greater than zero and less than about two.

64. The amplifier circuit of claim 63, wherein the non-inverting amplifier is coupled between said output and said inverting input.

65. The amplifier circuit of claim 63, wherein the non-inverting amplifier is coupled between said output and said non-inverting input.

* * * * *

UNITED STATES PATENT AND TRADEMARK OFFICE
CERTIFICATE OF CORRECTION

PATENT NO.  : 5,327,095
DATED       : July 5, 1994
INVENTOR(S) : Gross et al.

It is certified that error appears in the above-indentified patent and that said Letters Patent is hereby corrected as shown below:

| Column | Line |  |
|--------|------|--|
| 3 | 63 | "it's" should be -- its -- |
| 5 | 9 | after "control" insert -- of -- |
| 5 | 67 | after "Thus" insert -- , -- |
| 16 | 29 | "including" should be -- includes -- |

Signed and Sealed this

Eleventh Day of July, 1995

Attest:

BRUCE LEHMAN

*Attesting Officer*       *Commissioner of Patents and Trademarks*